(12) United States Patent
Nakano et al.

(10) Patent No.: US 6,276,949 B1
(45) Date of Patent: Aug. 21, 2001

(54) SOCKET FOR IC PACKAGE

(75) Inventors: Tomohiro Nakano, Fujisawa; Akira Kaneshige, Musashino, both of (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 09/593,633

(22) Filed: Jun. 13, 2000

(30) Foreign Application Priority Data

Jun. 18, 1999 (JP) .................................................. 11-172850

(51) Int. Cl.⁷ .................................................. H01R 13/62
(52) U.S. Cl. ........................................... 439/159; 439/330
(58) Field of Search .................................... 439/159, 152, 439/330, 153, 70, 71, 72, 73, 155, 264

(56) References Cited

U.S. PATENT DOCUMENTS

| | | | |
|---|---|---|---|
| 4,533,192 | * | 8/1985 | Kelley ........................................ 339/45 |
| 4,799,897 | * | 1/1989 | Mogi et al. ............................ 439/264 |
| 4,832,610 | * | 5/1989 | Matsuoka .............................. 439/159 |
| 5,002,499 | * | 3/1991 | Matsuoka .............................. 439/342 |
| 5,320,550 | * | 6/1994 | Uratsuji et al. ....................... 439/266 |
| 5,348,489 | * | 9/1994 | Yeh ........................................ 439/159 |
| 5,470,247 | * | 11/1995 | Fuchigami ............................ 439/264 |
| 5,531,608 | * | 7/1996 | Abe ....................................... 439/159 |
| 5,865,639 | * | 2/1999 | Fuchigami et al. .................... 439/330 |

FOREIGN PATENT DOCUMENTS

| | | | |
|---|---|---|---|
| 2 274 212 | * | 7/1994 | (GB) . |
| 6-203926 | * | 7/1994 | (JP) . |
| 9-162332 | * | 6/1997 | (JP) . |

* cited by examiner

*Primary Examiner*—Tho D. Ta
(74) *Attorney, Agent, or Firm*—Charles S. Cohen

(57) ABSTRACT

A socket is provided for an IC package having a plurality of contacts. The socket includes a body mounting a plurality of terminals and having a receptacle in the top thereof for receiving the IC package with the contacts in engagement with the terminals. At least one retainer/ejector member is mounted on the socket body adjacent the receptacle for movement relative to the body from a first position retaining the IC package in the receptacle and a second position at least partially ejecting the IC package from the receptacle. An actuator member is movably mounted on the socket body. The actuator member is operatively associated with the retainer/ejector member for moving the retainer/ejector member from its first position to its second position.

14 Claims, 7 Drawing Sheets

SOCKET FOR IC PACKAGE

FIELD OF THE INVENTION

This invention generally relates to the art of IC sockets and, particularly, to a retention/ejection system for an IC package mounted within the socket.

BACKGROUND OF THE INVENTION

An IC socket is used for performing burn-in tests of IC packages. In other words, an IC package is tested for a given number of hours at given, sometimes elevated, temperatures to ensure that the IC package will not fail during normal operation. Such an IC socket typically includes a dielectric socket body or housing which mounts a plurality of terminals in respective terminal-receiving passages in the body. In some sockets, first contact ends of the terminals receive respective solder balls of a ball grid array of the IC package, for instance. The opposite ends of the terminals have tails which engage circuit traces on a printed circuit board. Spring portions typically are provided intermediate the opposite contact ends of the terminals for applying contact pressure at the interconnections with the solder balls and the printed circuit board. Burn-in sockets of this type are shown in Japanese Unexamined Patent Publication Nos. Heisei 6-203926 and 9-162332.

During a burn-in test, it is necessary that the IC package be held by some form of retaining means whereby the respective solder balls of the package are maintained in contact with the respective contact terminals of the IC socket with sufficient pressure to overcome any oxide film on the surface of the solder balls in order to obtain reliable connections between the solder balls and contact terminals. Unfortunately, problems arise during the testing under high pressure in that the solder balls may melt quite slightly and become adhered to the contact ends of the terminals. Consequently, it may be difficult to remove the IC package from the socket after testing. The present invention is directed to solving these problems by providing an IC socket of the character described with a new and improved retainer/ejector system for holding the IC package in and ejecting the IC package from the IC socket.

SUMMARY OF THE INVENTION

An object, therefore, of the invention is to provide a new and improved socket for an IC package having a plurality of contacts.

In the exemplary embodiment of the invention, the IC socket includes a socket body mounting a plurality of terminals and having a receptacle in the top of the body for receiving the IC package with the contacts thereof in engagement with the terminals. At least one retainer/ejector member is mounted on the socket body adjacent the receptacle for movement relative to the body from a first position retaining the IC package in the receptacle and a second position at least partially ejecting the IC package from the receptacle. An actuator member is movably mounted on the socket body and is operatively associated with the retainer/ejector member for moving the retainer/ejector member from its first position to its second position.

A support frame also may be movably mounted on the socket body about the receptacle and on which the IC package is supported. The retainer/ejector member includes a retaining portion for engaging the IC package and holding the package in the receptacle. The retainer/ejector member includes an ejecting portion for engaging and moving the support frame and, thereby, at least partially ejecting the IC package.

As disclosed herein, the receptacle is generally rectangular and is generally centrally located in the top of the socket body. A plurality of the retainer/ejector members are spaced about the receptacle, preferably at each of the four sides of the rectangular receptacle.

In the preferred embodiment, each retainer/ejector member is provided in the form of an arm pivotally mounted on the socket body at a side of the receptacle and cantilevered into the receptacle when in its first or retaining position. The arm has a retaining portion near a distal end thereof for engaging the IC package and holding the package in the receptacle. The arm has an ejecting portion near a proximal end thereof adjacent the pivot point of the arm for engaging the support frame for the IC package. The actuator member is provided in the form of an actuator rim mounted to the top of the socket body substantially surrounding the receptacle and operatively associated with all of the plurality of retainer/ejector arms.

Other features of the invention include complementary interengaging cam means between the retainer/ejector arms and the actuator rim for moving the arms in response to movement of the rim. A plurality of springs are spaced about the actuator rim between the rim and the socket body for biasing the rim toward a retaining position and, thereby, bias the retainer/ejector arms toward their first or retaining positions.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
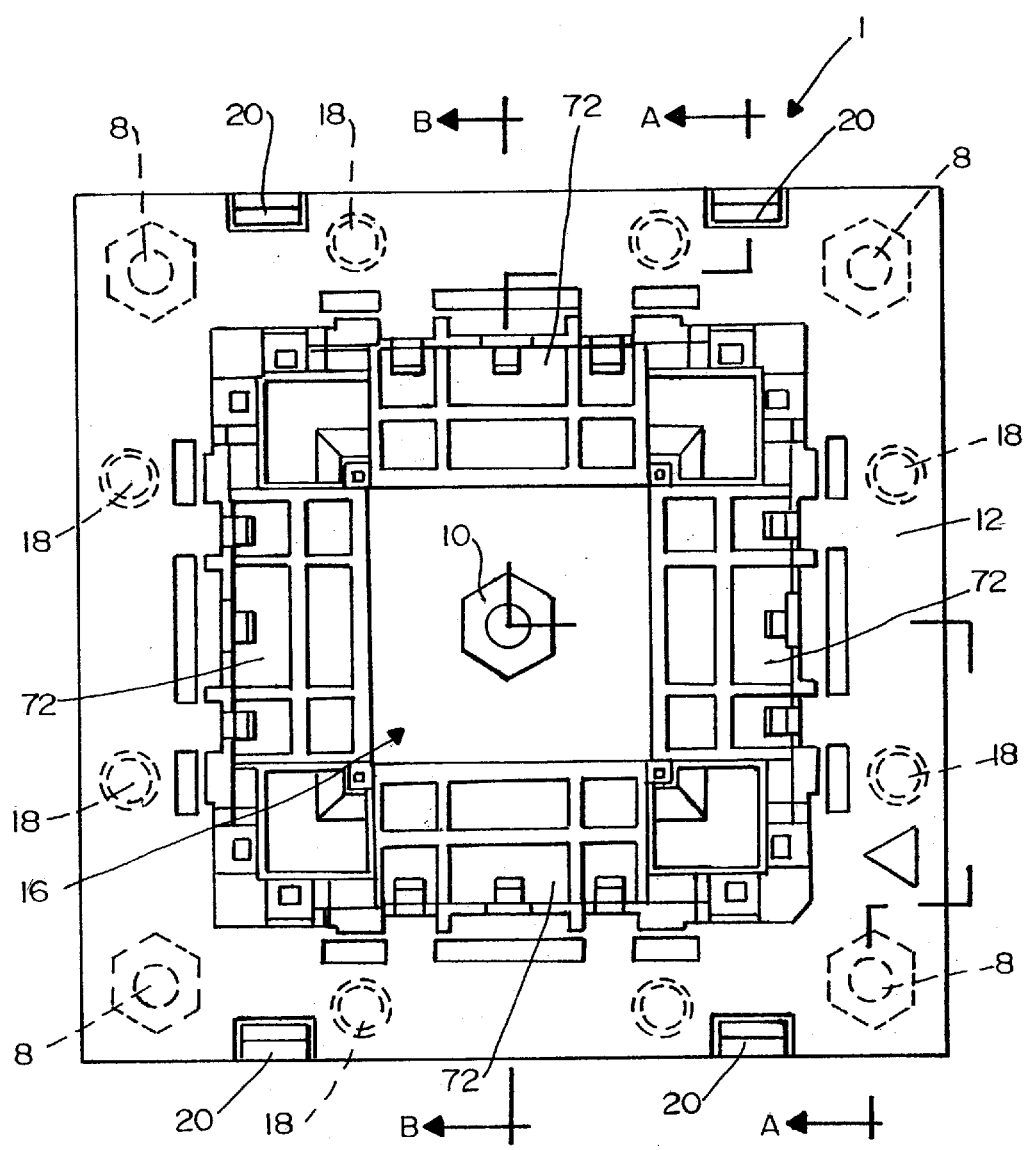
FIG. 1 is a top plan view of an IC socket embodying the concepts of the invention.
Figures 2, 3:
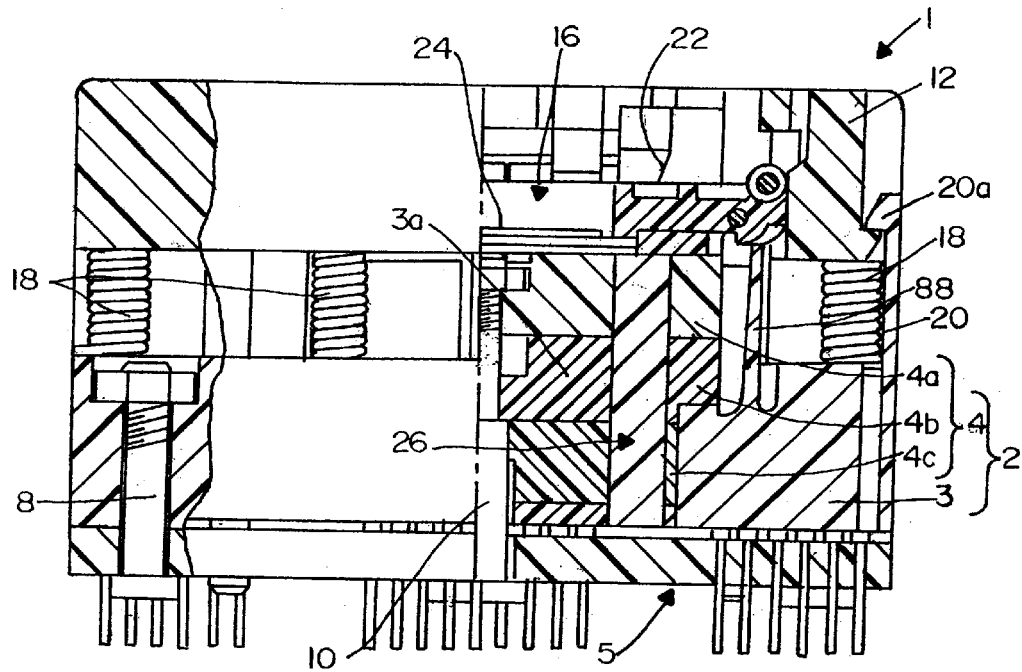
FIG. 2 is a fragmented vertical section taken generally along line A—A of FIG. 1 and showing an IC package in a burn-in test phase.
FIG. 3 is a fragmented vertical section taken generally along line B—B of FIG. 1 and, again, showing the IC package in the burn-in test phase.

Referring to the drawings in greater detail, and first to FIGS. 1–3, an IC socket for performing burn-in tests is generally designated 1. The socket includes a socket body 2 which is an assembly formed by an outer cup-shaped housing 3 defining a rectangular center opening 3a and an inner housing 4 received in the center opening. Inner housing 4 is formed by three rectangular housing segments 4a, 4b and 4c which are stacked within center opening 3a of outer housing 3.

A printed circuit board, generally designated 5, is fixed by four bolts 8 to the lower surface of outer housing 3. Housing segments 4a, 4b and 4c are fixed within center opening 3a of outer housing 3 by a stepped bolt 10. The stepped bolt extends upwardly through printed circuit board 5 and into the outer housing.

An actuator rim 12 is positioned onto a top surface 14 of outer housing 3. The actuator rim has a square center opening, generally designated 16, and is biased upwardly by eight coil springs 18 sandwiched between the actuator rim and the outer housing. The actuator rim is held down onto the outer housing by the engagement of hooks 20a (FIG. 2) of a plurality of latch arms 20 fixed to opposite sides of outer housing 3. Therefore, actuator rim 12 is resilient held on top of the housing and can be depressed against the biasing of springs 18, while hooks 20a of latch arms 20 limit movement of the cover upwardly or away from the housing. While FIGS. 2 and 3 show actuator rim 12 biased upwardly by springs 18, FIG. 4 shows the cover pushed downwardly in the direction of arrow "X", as will be described in greater detail hereinafter.

Center opening 3a of outer housing 3 is provided with tapered guiding surfaces 22 at the four corners of the opening for guiding the corners of a rectangular IC package 24 into the top of the opening. At this point, it should be understood that such terms as "top", "bottom", "upwardly", "downwardly" and the like are used herein to provide a clear and concise description and understanding of the invention in view of the orientation of IC socket 1 in the drawings. However, it should be understood that such terms herein and in the claims hereof are not intended to be limiting.

Figure 4:
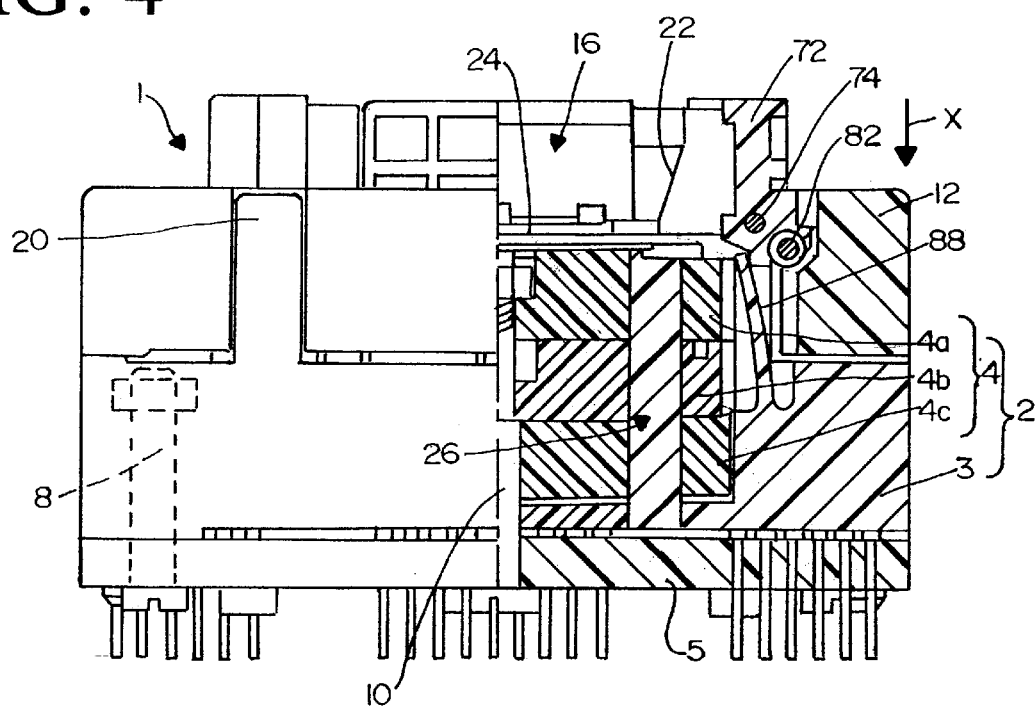
FIG. 4 is a view similar to that of FIG. 3, but with the actuator rim depressed and the retainer/ejector arms pivoted upwardly for removing the IC package.
Figure 6:
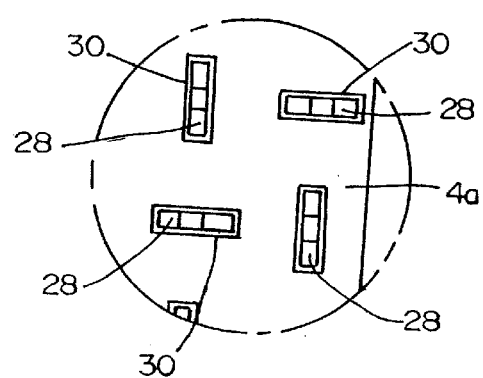
FIG. 6 is an enlarged plan view of an isolated cluster of terminal-receiving passages and terminals, looking generally in the direction of line C—C of FIG. 5.
Figure 5:
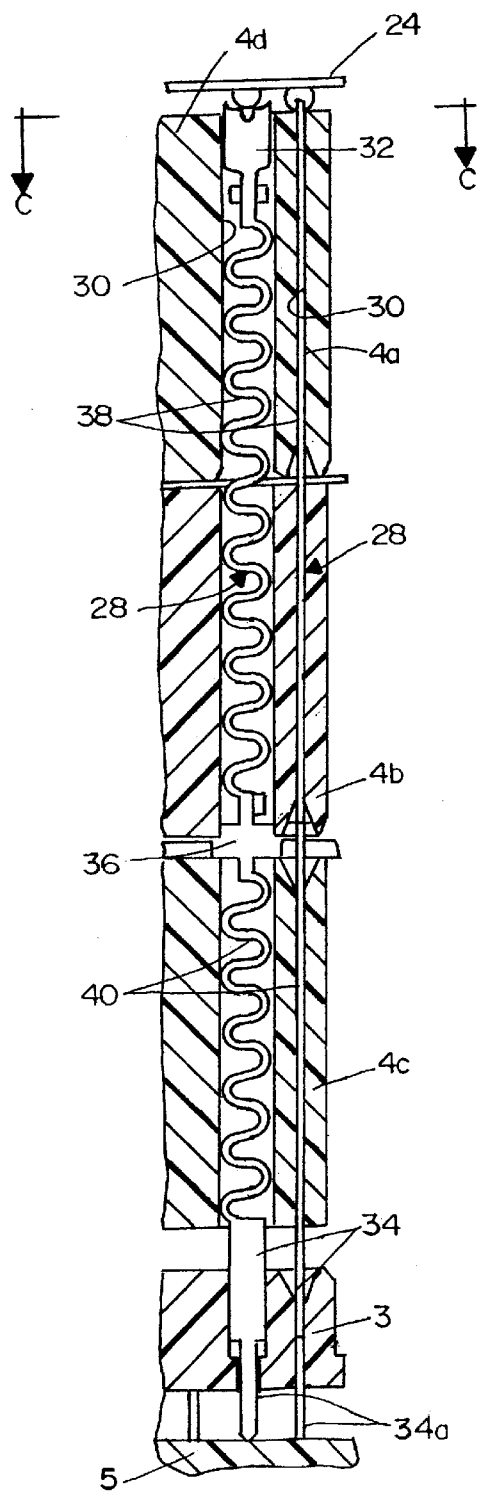
FIG. 5 is an enlarged fragmented vertical section through a portion of the IC socket to show one of the terminals interengaged between the IC package and the printed circuit board.

FIGS. 2–4 show a terminal area, generally designated 26, somewhat schematically by phantom/solid line cross-hatching, because the details would be too fine to show in these figures. Suffice it to say, it can be seen that the terminal areas are generally along each edge of housing segments 4a, 4b and 4c of inner housing 4. More particularly, referring to FIG. 5, a plurality of terminals, generally designated 28, are mounted in a respective plurality of terminal-receiving passages 30 which extend in aligned fashion through the stacked inner housing segments 4a, 4b and 4c. FIG. 6 shows a cluster of four terminal-receiving passages and respective terminals to illustrate that all of the terminals are in alternating perpendicular orientations relative to adjacent terminals about the four edges of the stacked housing segments. As seen in FIG. 5, terminal-receiving passages 30 are open at the top of upper housing segment 4a and at the bottom of lower housing segment 4c.

Figure 9:
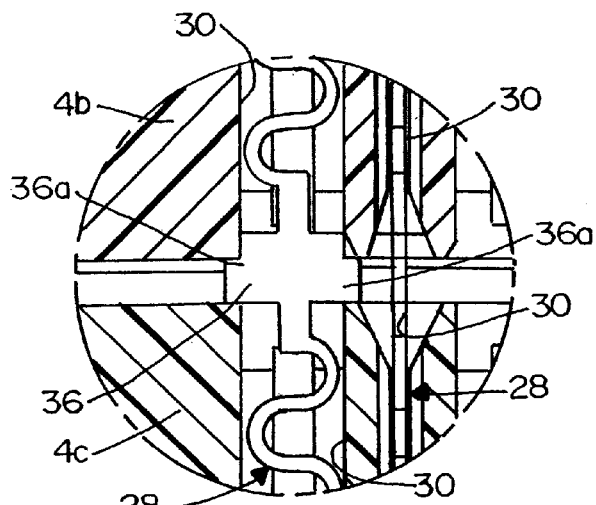
FIG. 9 is an enlarged isolated section through the area of retention for a pair of the terminals in the IC socket.

Each terminal 28 includes a top contact end 32 and a bottom contact end 34 which terminates in a tail portion 34a. Each terminal includes an enlarged intermediate retention section 36 for fixing the terminal in its respective passage 30, as described below. Each terminal includes a first or top spring section 38 which extends between retention section 36 and top contact end 32. A second or bottom spring section 40 extends between retention section 36 and bottom contact section 34. Each terminal is stamped or blanked from conductive sheet metal material, and it can be seen that spring sections 38 and 40 are stamped in a sinuous or wave-spring configuration. The spring sections generally have the same cross-dimensions, but it can be seen that top spring section 38 is longer than bottom spring section 40. Therefore, the top spring section is more resilient than the bottom spring section and, as a result, the top spring section will exert a lesser longitudinal force toward top contact end 32 than the forces applied by bottom spring section 40 on bottom contact end 34/34a. Referring to FIG. 9 in conjunction with FIG. 5, it can be seen that retention section 36 of each terminal 28 is enlarged laterally to define a pair of outwardly projecting flanges 36a which are sandwiched between housing segments 4b and 4c of inner housing 4. This fixes the terminals within their respective terminal-receiving passages 30 in the housing segments.

Figure 7:
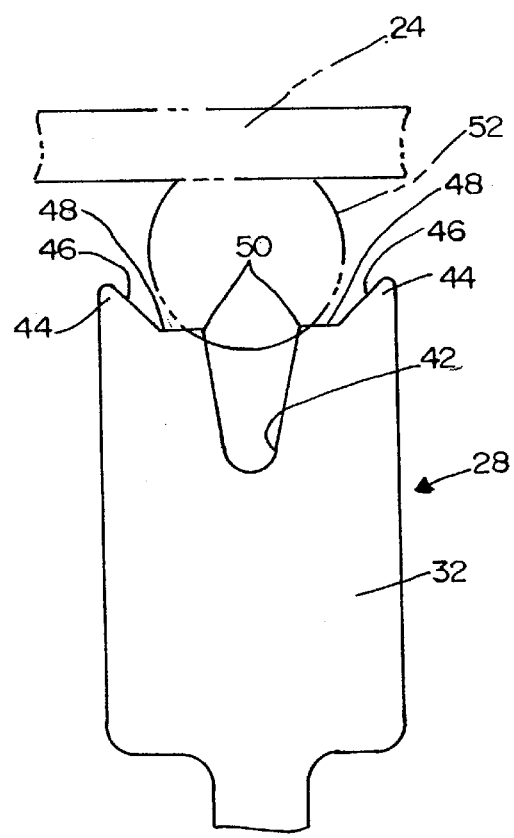
FIG. 7 is a fragmented, isolated view showing the contact end of one of the terminals in engagement with a respective solder ball of the IC package.
Figure 8:
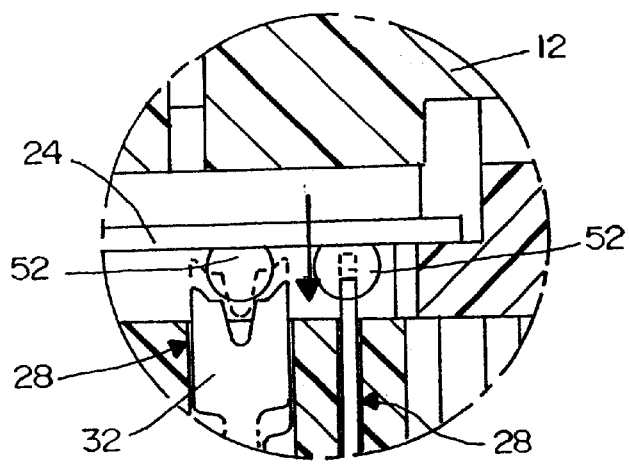
FIG. 8 is an enlarged isolated section through the socket showing the interengagement between a pair of the terminals and a pair of the solder balls of the IC package.
Figure 11:
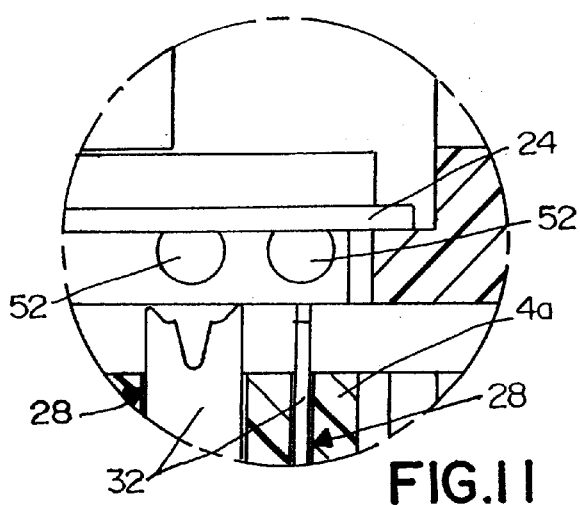
FIG. 11 is a view similar to that of FIG. 8, with the IC package and solder balls elevated above the terminals.

Referring to FIG. 7 in conjunction with FIG. 5, top contact end 32 of each terminal 28 is bifurcated at the distal end thereof to form a recessed area 42 between a pair of symmetrical contact portions 44. The contact portions have oblique faces 46 which extend to horizontal stepped faces 48 which, in turn, terminate at pointed edges 50. The pointed edges of each contact end 32 engage a respective one of a plurality of solder balls 52 of IC package 24. FIG. 8 shows how contact ends 32 of terminals 28 yield downwardly in the direction of arrow "Y" when pressure is applied by IC package 24 and solder balls 52 onto the contact ends. FIG. 11 shows the IC package and solder balls lifted off of contact ends 32 of terminals 28, whereupon the terminals return to their unstressed conditions.

Figure 10:
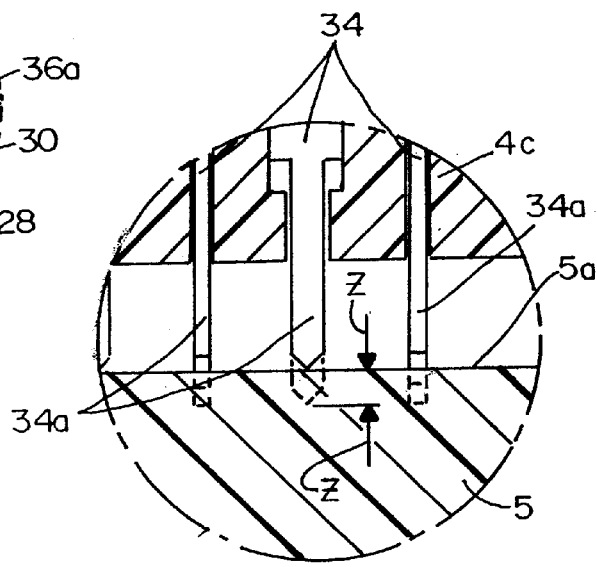
FIG. 10 is a view similar to that of FIG. 8, but showing the bottom or tail areas of the terminals in engagement with the printed circuit board.

FIG. 10 shows bottom contact ends 34 and tail portions 34a of three terminals in engagement with a top surface 5a of printed circuit board 5. It can be seen that the bottom contact ends have been biased upwardly an amount indicated by arrows "C" under the resiliency of bottom spring sections 40 (FIG. 5) of the terminals. Tail portions 34a will be in engagement with circuit traces on top surface 5a of the printed circuit board.

Figure 12:
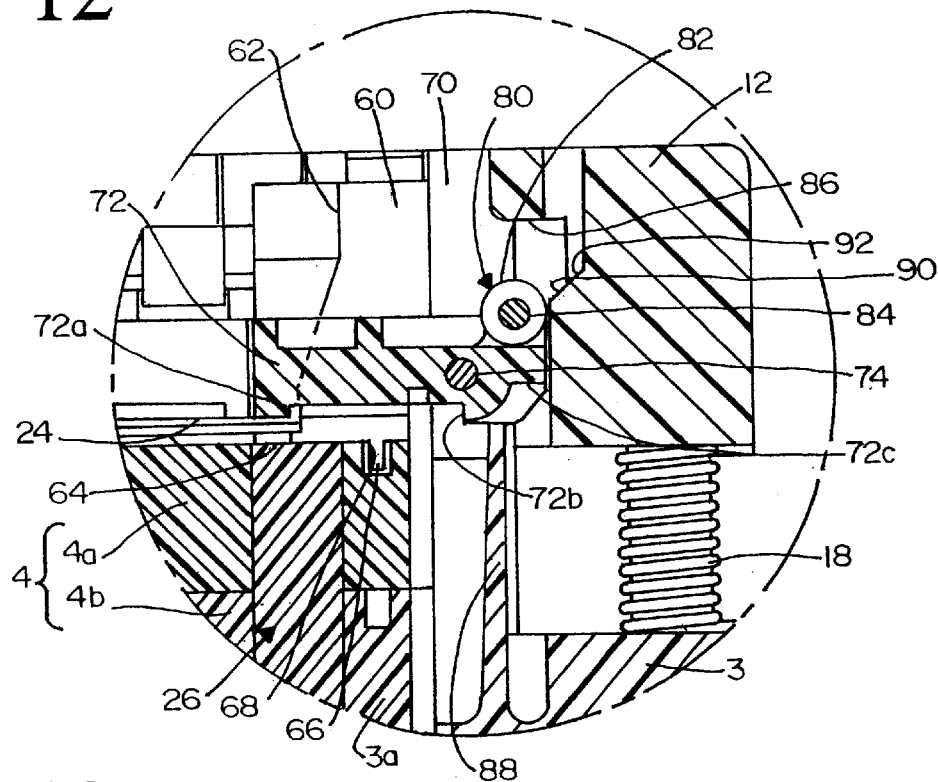
FIG. 12 is an enlarged isolated section through the socket in the area of one of the retainer/ejector arms, showing the arm in its retaining position.

Referring to FIG. 12 in conjunction with FIGS. 2 and 3, a rectangular support frame 60 has a rectangularly shaped central opening 62 within which IC package 24 is mounted and rests on a seating surface 64 about the inside of the support frame. A bottom peripheral flange 66 depends from the support frame into a groove 68 in a top surface of upper housing segment 4a of inner housing 4. Support frame 60 is disposed within an upstanding portion 70 of outer housing 3. Therefore, support frame 60 can move up and down with IC package 24.

Still referring to FIG. 12 in conjunction with FIGS. 2 and 3, a retainer/ejector arm 72 is pivotally mounted at point 74 to upstanding portion 70 of the outer housing. One of the retainer/ejector arms 72 is disposed at each of the four sides of center opening 16. Arm 72 is shown in FIG. 12 in a first or retaining position whereby a retaining portion 72a at a distal end of the arm is disposed on top of IC package 24 at an edge thereof to hold the IC package in the IC socket. The retainer/ejector arm also includes an ejecting portion or surface 72b at a proximal end of the arm near pivot point 74. As will be seen hereinafter, ejecting surface 72b is positioned for engaging support frame 60 to raise the support frame and eject the IC package from the socket. Still further, each retainer/ejector arm 72 includes an abutment surface 72c for a purpose to be described hereinafter. Therefore, it can be seen that each retainer/ejector arm is cantilevered from pivot point 74 out over center opening 3a in outer housing 3 as well as into the center opening within actuator rim 12.

Generally, and still referring to FIG. 12, complementary interengaging cam means, generally designated 80, are disposed between each retainer/ejector arm 72 and actuator rim 12 for moving the retainer/ejector arms in response to movement of the actuator rim. More particularly, a cam roller 82 is rotatably mounted on a shaft 84 on each retainer/ejector arm 72. Actuator rim 12 has a cam shoulder 86 facing the cam roller. Before proceeding with the operation of the system in relation to FIGS. 13 and 14, FIG. 12 shows that outer housing 3 has an integral, upstanding spring arm 88 which includes an upper distal end 88a in the path of rotation of surface 72c of retainer/ejector arm 72.

The operation of the retaining/ejecting system of the invention now will be described in relation to FIGS. 12–14. Referring first to FIG. 12, the retaining position of retainer/ejector arm 72 is shown. In this position, springs 18 bias actuator rim 12 upwardly which causes a surface 90 on the actuator rim to engage cam roller 82. This engagement causes retainer/ejector arm 72 to be forced inwardly and downwardly so that its distal end 72a engages the top of IC package 24 at the edge thereof to hold the IC package within the socket.

Figure 13:
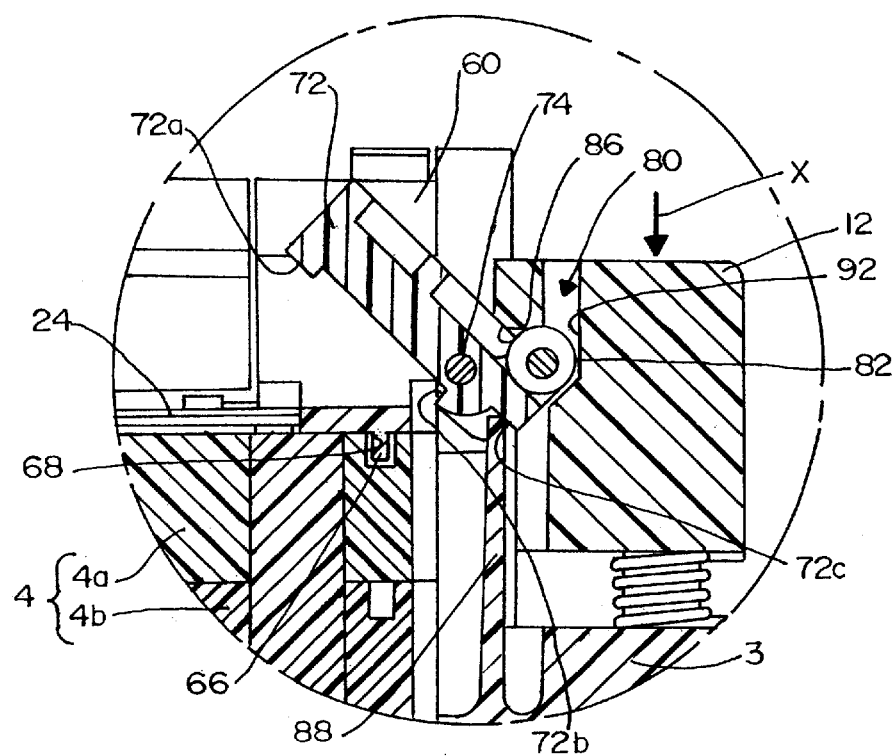
FIG. 13 is a view similar to that of FIG. 12, but showing the retainer/ejector arm partially moved away from its retaining position.

When it is desired to eject IC package 24 from the socket, pressure is exerted onto actuator rim 12 in the direction of arrow "X" as seen in FIG. 13. This causes cam shoulder 86 on the actuator rim to engage the top of cam roller 82 and rotate retainer/ejector arm 72 upwardly about pivot 74. This lifts retaining surface 72a of the arm off of the IC package. It can be seen that cam roller 82 has entered a recessed area 92 in the actuator rim which is provided to accommodate rotating movement of the cam roller.

Figure 14:
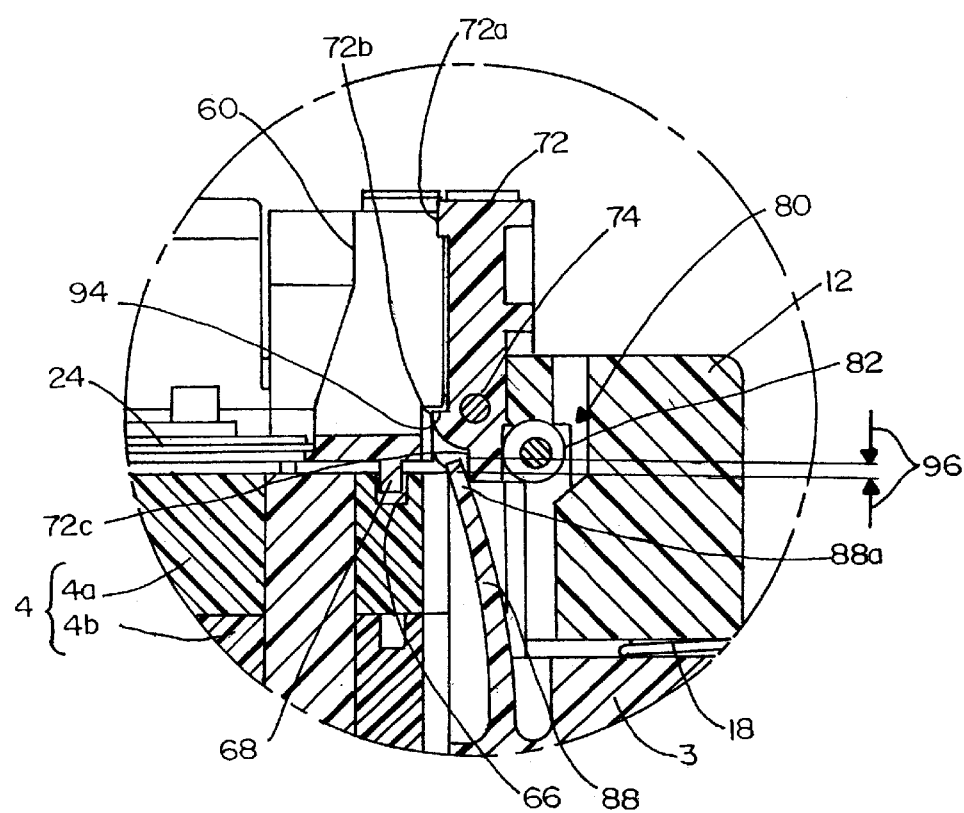
FIG. 14 is a view similar to that of FIGS. 12 and 13, but showing the arm moved all of the way to its ejecting position.

Referring to FIG. 14, further downward movement of actuator rim 12 causes further rotation of retainer/ejector arm 72 upwardly about pivot 74 until the arm attains a substantially vertical orientation, as shown. This further movement effects two functions. First, ejecting surface 72b of the arm engages a shoulder 94 of support frame 60 and lifts the support frame upwardly an amount as indicated by arrows 96. Since IC package 24 is mounted on support frame 60, the IC package also is lifted upwardly and at least partially ejected from the socket. Second, surface 72c of retainer/ejector arm 72 engages upper distal end 88a of spring arm 88 to cock the spring arm and spring load the retainer/ejector arm. Therefore, when pressure on actuator rim 12 is removed, spring arm 88 is effective to bias retainer/ejector arm 72 back downwardly as springs 18 bias the actuator rim upwardly.

The amount of upward ejecting movement of support frame 60 and, thereby, IC package 24 as indicated by arrows 96 in FIG. 14, is sufficient to accommodate the yielding of contact ends 32 of terminals 28 as described in relation to FIGS. 7, 8 and 11. In addition, the amount of upward ejecting movement also is sufficient to break any adhesion between contact ends 32 of the terminals and solder balls 52, particularly at pointed edges 50 (FIG. 7) of the terminals.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

What is claimed is:

1. A socket for an IC package having a plurality of contacts, comprising:
   a socket body mounting a plurality of terminals and including a receptacle in the top thereof for receiving the IC package with said contacts in engagement with the terminals;
   at least one retainer/ejector member mounted on the socket body adjacent said receptacle for movement relative to the body from a first position retaining the IC package in the receptacle and a second position at least partially ejecting the IC package from the receptacle;
   an actuator member movably mounted on the socket body and operatively associated with the retainer/ejector member for moving the retainer/ejector member from its first position to its second position;
   a support frame movably mounted on the socket body about said receptacle and on which the IC package is supported; and
   wherein said retainer/ejector member includes an ejecting portion for engaging and lifting the support frame and thereby, at least partially ejecting the IC package from the receptacle when said retainer/ejector member is in said second position.

2. The socket of claim 1 wherein said retainer/ejector member includes a retaining portion for engaging the IC package and holding the package in the receptacle.

3. The socket of claim 1, including spring means between the actuator member and the socket body for biasing the actuator member toward a retaining position and, thereby, bias the retainer/ejector member toward its first position; and said socket body includes an integral spring arm configured to engaged said retainer/ejector member when said retainer/ejector member is in said second position to bias said retainer/ejector towards said first position.

4. The socket of claim 1 wherein said receptacle is generally centrally located in the top of the socket body, and including a plurality of said retainer/ejector members spaced about the receptacle.

5. The socket of claim 4 wherein said receptacle is generally rectangular, and including at least one of the retainer/ejector members at each of the four sides of the rectangular receptacle.

6. The socket of claim 1 wherein said actuator member comprises an actuator rim mounted at the top of the socket body substantially surrounding the receptacle.

7. The socket of claim 6, including a plurality of said retainer/ejector members spaced about the receptacle and operatively associated with the actuator rim.

8. A socket for an IC package having a plurality of contacts, comprising:
   a socket body mounting a plurality of terminals and including a central receptacle in the top thereof for receiving the IC package with said contacts in engagement with the terminals;
   a plurality of retainer/ejector arms pivotally mounted on the socket body spaced about the receptacle, each arm being pivotally movable relative to the body from a first position cantilevered into the receptacle for retaining the IC package in the receptacle and a second position at least partially ejecting the IC package from the receptacle, each arm including a retaining portion near a distal end thereof for engaging the IC package and holding the package in the receptacle and an ejecting portion near a proximal end thereof adjacent a pivot point of the arm;

an actuator rim mounted at the top of the socket body substantially surrounding the receptacle and movable relative to the socket body, the actuator rim being operatively associated with the retainer/ejector arms for moving the arms from their first position to their second position;

complementary interengaging cam means between each retainer/ejector arm and the actuator rim for moving the arms in response to movement of the actuator rim; and spring means between the actuator rim and the socket body for biasing the actuator rim toward a retaining position and, thereby, bias the retainer/ejector arms toward their first position.

9. The socket of claim 8 wherein said receptacle is generally rectangular, and including at least one of the retainer/ejector members at each of the four sides of the rectangular receptacle.

10. The socket of claim 8, including a support frame movably mounted on the socket body about said receptacle and on which the IC package is supported.

11. The socket of claim 10 wherein said ejecting portion of each retainer/ejector arm engages and moves the support frame and thereby, at least partially ejects the IC package.

12. A socket for an IC package having a plurality of contacts, comprising:

a socket body mounting a plurality of terminals and including a receptacle in the top thereof for receiving the IC package with said contacts in engagement with the terminals;

at least one retainer/ejector member mounted on the socket body adjacent said receptacle for movement relative to the body from a first position retaining the IC package in the receptacle and a second position at least partially ejecting the IC package from the receptacle;

an actuator member movably mounted on the socket body and operatively associated with the retainer/ejector member for moving the retainer/ejector member from its first position to its second position; and complementary interengaging cam means between the retainer/ejector member and the actuator member for moving the retainer/ejector member in response to movement of the actuator member.

13. A socket for an IC package having a plurality of contacts, comprising:

a socket body mounting a plurality of terminals and including a receptacle in the top thereof for receiving the IC package with said contacts in engagement with the terminals;

at least one retainer/ejector member mounted on the socket body adjacent said receptacle for movement relative to the body from a first position retaining the IC package in the receptacle and a second position at least partially ejecting the IC package from the receptacle;

an actuator member movably mounted on the socket body and operatively associated with the retainer/ejector member for moving the retainer/ejector member from its first position to its second position; and a spring arm integrally formed as a one-piece construction with said socket body, said spring arm configured to engage said retainer/ejector member when said retainer/ejector member is in said second position to bias said retainer/ejector member towards said first position.

14. The socket of claim 13 including complementary interengaging cam means between the retainer/ejector member and the actuator member for moving the retainer/ejector member in response to movement of the actuator member.

* * * * *